(12) United States Patent
Reid et al.

(10) Patent No.: US 10,034,412 B2
(45) Date of Patent: Jul. 24, 2018

(54) DEVICE WITH HEAT TRANSFER PORTION (71) Applicant: AKER SOLUTIONS LIMITED, London (GB)

(72) Inventors: Stuart Reid, Maidenhead (GB); Daniel Ahrens, Maidenhead (GB); Kenneth Hood, Maidenhead (GB)

(73) Assignee: AKER SOLUTIONS LIMITED, London (GB)

( * ) Notice: Subject to any disclaimer, the term of this patent is extended or adjusted under 35 U.S.C. 154(b) by 95 days.

(21) Appl. No.: 14/875,973

(22) Filed: Oct. 6, 2015

(65) Prior Publication Data
US 2016/0100505 A1 Apr. 7, 2016

(30) Foreign Application Priority Data

Oct. 7, 2014 (GB) .................................. 1417749.7

(51) Int. Cl.
*H05K 7/20* (2006.01)
*H05K 13/04* (2006.01)
*H05K 7/14* (2006.01)

(52) U.S. Cl.
CPC ..... *H05K 7/20436* (2013.01); *H05K 7/20545* (2013.01)

(58) Field of Classification Search
CPC ........... H05K 7/20436; H05K 7/20545; H05K 1/0204; H05K 1/0271; H05K 1/185; H05K 7/20; H05K 7/2039; H05K 7/205; H05K 7/209; H05K 7/20909; H01L 2924/181; H01L 24/19; H01L 23/367; H01L 21/4857; H01L 2224/04105; H01L 2225/06589; H01L 23/49822; E21B 21/003; E21B 41/02; E21B 36/001; E21B 47/065; E21B 4/003; F28F 3/02; F28F 21/00; F28F 21/065; F28F 21/08; H02J 2001/004; Y10T 29/49353
See application file for complete search history.

(56) References Cited

U.S. PATENT DOCUMENTS

| | | | | |
|---|---|---|---|---|
| 4,547,833 A * | 10/1985 | Sharp | .................... | B60B 33/045 174/544 |
| 5,220,485 A * | 6/1993 | Chakrabarti | ......... | H05K 7/1404 165/185 |
| 5,931,000 A * | 8/1999 | Turner | .................. | E21B 36/003 166/66 |
| 6,134,892 A * | 10/2000 | Turner | .................. | E21B 36/003 166/66 |
| 7,440,283 B1 * | 10/2008 | Rafie | ..................... | E21B 47/011 165/185 |

(Continued)

OTHER PUBLICATIONS

Search Report for GB1417749.7 dated Mar. 24, 2015, six pages.

*Primary Examiner* — James Wu
*Assistant Examiner* — Michael Matey
(74) *Attorney, Agent, or Firm* — Nixon & Vanderhye P.C.

(57) ABSTRACT

A subsea electronic device includes a housing, a chassis within the housing to which one or more electronic cards are mounted and heat transfer sections in thermal contact with the electronic cards. The heat transfer sections are in interference fit with an inner surface of the housing thereby to transfer, in use, heat from the electronic cards through the heat transfer sections to the housing. There is also a subsea electronic device housing and a method of assembling a subsea electronic device.

20 Claims, 3 Drawing Sheets (56) References Cited

U.S. PATENT DOCUMENTS

| | | | | |
|---|---|---|---|---|
| 7,806,173 | B2* | 10/2010 | Kaul | E21B 47/011 |
| | | | | 166/57 |
| 8,498,125 | B2* | 7/2013 | Hall | E21B 47/011 |
| | | | | 361/735 |
| 2004/0175092 | A1* | 9/2004 | Young | G02B 6/4201 |
| | | | | 385/138 |
| 2006/0117759 | A1* | 6/2006 | Hall | E21B 47/011 |
| | | | | 62/3.2 |
| 2007/0251844 | A1* | 11/2007 | Reid | A63B 55/00 |
| | | | | 206/315.3 |
| 2008/0314638 | A1 | 12/2008 | Kaul et al. | |
| 2011/0079391 | A1 | 4/2011 | Bedouet et al. | |
| 2011/0272154 | A1* | 11/2011 | Kaul | E21B 36/001 |
| | | | | 166/272.1 |
| 2013/0025886 | A1* | 1/2013 | Martinez | E21B 47/011 |
| | | | | 166/386 |
| 2013/0233564 | A1* | 9/2013 | Pacey | E21B 34/14 |
| | | | | 166/373 |
| 2013/0319685 | A1* | 12/2013 | Pike | E21B 41/00 |
| | | | | 166/378 |
| 2014/0199083 | A1* | 7/2014 | Willoughby | G02B 6/4448 |
| | | | | 398/180 |
| 2014/0312752 | A1* | 10/2014 | Durisotti | E21B 47/011 |
| | | | | 312/237 |
| 2015/0168087 | A1* | 6/2015 | Kim | F28F 21/08 |
| | | | | 361/720 |
| 2015/0230365 | A1* | 8/2015 | Kaplun | B23P 15/26 |
| | | | | 361/689 |
| 2015/0289413 | A1* | 10/2015 | Rush | H05K 7/20672 |
| | | | | 361/700 |
| 2017/0170640 | A1* | 6/2017 | Hansen | H02B 1/28 |

* cited by examiner

DEVICE WITH HEAT TRANSFER PORTION

This application claims priority to GB 1417749.7 filed 7 Oct. 2014, the entire content of which is hereby incorporated by reference.

TECHNICAL FIELD

This invention relates generally to subsea installations. More specifically, although not exclusively, this invention relates to subsea electronic devices, such as electronic modules, for incorporation into control systems used in subsea exploration, drilling and development of oil and gas fields in underwater locations.

BACKROUND

Global energy demand is increasing, which is putting pressure on the oil and gas industry to improve the effectiveness of extraction from mature fields and to explore fields that are smaller and located in more challenging environments, including ultra-deepwater environments. The development of subsea oil and gas fields requires specialised equipment that must be robust and reliable to safeguard both the equipment itself and the environment and to make the exploitation of the subsea hydrocarbons economically feasible. The deployment and repair of subsea equipment requires specialised vessels equipped with diving and robotic equipment and so interventions to replace or repair such equipment is generally very expensive.

Subsea equipment is often controlled by electronic modules that typically include printed wiring boards with multiple integrated circuits fitted within a housing. These integrated circuits will typically generate a significant amount of waste heat during operation. Failure to manage this waste heat and prevent the build-up of excessive temperatures can result in reduced product lifetimes and component failures, leading to expensive interventions.

Convection cooling into the surrounding air is a commonly used technique for reducing the temperature of integrated circuits and is often optimised by using large surface area heat sinks and cooling fans, which accelerate the heat transfer.

However, in subsea electronics modules it is desirable to reduce the size, wall thickness and weight of the pressure vessel. This inevitably results in a small volume of air or dry Nitrogen within the sealed electronics assembly which limits the amount of convection cooling that can occur.

BRIEF SUMMARY

It is therefore a first non-exclusive object of this invention to provide an improved subsea electronic device that overcomes or at least mitigates these competing factors. It is a further, more specific non-exclusive object of the invention to provide a subsea electronic device that incorporates an improved cooling means.

Accordingly, a first aspect of the invention provides an electronic device or module, for example a subsea electronic device or module, the device or module comprising a housing, a chassis within the housing to which one or more electronic elements are mounted and a heat transfer portion or part in thermal contact with the one or more electronic elements, wherein the heat transfer portion or part is urged against and/or in interference fit with the housing, e.g. an inner surface thereof, thereby to transfer, in use, heat from the one or more electronic elements, for example through the heat transfer portion or part, to the housing.

Thus, the invention provides a reliable means of transferring heat by conduction from the one or more electronic elements to the housing, which enables the temperature of the electronic elements to be maintained.

Another aspect of the invention provides a housing assembly, for example a subsea housing assembly, e.g. for receiving one or more electronic elements or devices, the assembly comprising a housing, a chassis within the housing to which one or more electronic elements may be mounted or are mountable and a heat transfer portion or part in thermal contact with the chassis, wherein the heat transfer portion or part is urged against and/or in interference fit with the housing, e.g. an inner surface thereof, thereby to enable heat to be transferred, in use, from one or more electronic elements mounted to the chassis, for example through the heat transfer portion or part, to the housing.

The heat transfer portion or part or at least part thereof may be movable, for example relative to the chassis or at least a portion thereof, e.g. to enable it to be urged against the housing or inner surface thereof and/or to create the interference fit. Additionally or alternatively, the heat transfer portion or part may comprise an adjustment means, e.g. for urging the heat transfer portion or part or portion part away from the chassis and/or against the housing or inner surface thereof.

Another aspect of the invention provides a heat transfer device, e.g. for use as a heat transfer portion or part in an electronic device as described above. The heat transfer device may comprise an adjustment means, e.g. for moving or urging, in use, the heat transfer device away from the chassis and/or against the housing or an inner surface thereof.

For the avoidance of doubt, any of the features described herein apply equally to any aspect of the invention.

In embodiments, the adjustment means is between the chassis or at least a portion thereof and the heat transfer portion or part or the at least part thereof and/or comprises an expanding wedge type fastener or wedge lock that may comprise an adjuster or fastener, which may be operable or rotatable to draw a pair of opposed wedges together to urge the chassis and heat transfer portion or part or part thereof apart. The adjustment means may additionally or alternatively comprise one or more adjustment elements or members, preferably two or more adjustment elements or members, which may be movable relative to one another and/or thermally conductive. The adjustment means may additionally or alternatively comprise a moving or driving element or member, for example a fastener, which may be adjustable, e.g. rotatable, for example to draw at least two of the two or more elements or ends thereof toward one another and/or to push or urge them apart or to separate them.

In some embodiments, the two or more adjustment elements or members comprise a pair of angled members, e.g. wedges or wedge shaped members, one or each of which may include a first or contacting or angled surface and/or a second or abutment surface, which may be or extend or lie at an angle, e.g. an acute angle, with respect to the first or contacting or angle surface. Preferably, the angle between the surfaces of each of a pair of adjustment elements or members is the same or equal or substantially the same or equal, for example such that the second or abutment surfaces of the angled members are parallel, e.g. when the first or contacting or angled surfaces are in contact with one another.

The two or more adjustment elements or members may be connected together, e.g. by the moving or driving element or member, for example with their angled surfaces abutting one another, e.g. to provide parallel opposed surfaces, which may be configured to contact a respective one of the chassis or at least a portion thereof and/or the heat transfer portion or part or the at least part thereof. Additionally or alternatively, the adjustment means or the moving or driving element or member may be configured or adjustable to draw the angled members or wider or thicker ends or distal ends thereof together or toward one another, e.g. to separate the second or abutment surfaces or to move them apart from one another or to increase the distance between them and/or to urge the heat transfer device away from the chassis and/or against the housing or inner surface thereof.

The heat transfer portion or part may comprise a deformable region, which may be configured to deform, e.g. in use and/or as it is urged against the housing or the inner surface thereof. The heat transfer portion may comprise one or more recesses or depressions, at least one or each of which may at least partially define the deformable region. The heat transfer portion or part may comprise a first side or surface, which may face or be adjacent to the chassis, and/or a second side or surface, e.g., opposite the first side or surface and/or which may face or be adjacent or abut the housing or the inner surface thereof and/or which may be curved and/or define a curved or cylindrical surface or periphery or peripheral surface, which may be an interrupted surface or periphery. The heat transfer portion or part may comprise one or more recesses or depressions in or on the first side or surface, at least one of which may comprise or receive an or a respective adjustment means. Additionally or alternatively, the heat transfer portion or part may comprise one or more recesses or depressions in or on the second side or surface, for example to define one or more heat transfer elements or ribs or fins.

The heat transfer portion or part may comprise two or more heat transfer elements or ribs or fins, for example with a respective recess or depression between each pair. At least one or each of the heat transfer elements may be in thermal contact with the one or more electronic elements and/or abut or be urged against and/or in interference fit with the or a respective inner surface of the housing.

In some embodiments, the assembly or device comprises two heat transfer portions or parts, which may be on the same or opposite sides of the chassis. At least one or each of the heat transfer portions or parts may be in thermal contact with the one or more electronic elements and/or abut or be urged against and/or in interference fit with the or a corresponding inner surface of the housing. In some embodiments, the assembly or device comprises three or more heat transfer portions or parts, e.g. about the periphery, such as spaced or spaced equally about the periphery, of the chassis. At least one or each of the heat transfer portions or parts may be in thermal contact with the one or more electronic elements and/or abut or be urged against and/or in interference fit with the or a corresponding inner surface of the housing.

At least one of the electronic elements may comprise or be included or mounted to or on a circuit board or electronic card, for example a printed circuit board or card, which may be clamped at or on or along at least one of its sides, e.g. to the chassis, for example by a clamping means or between a pair of clamping surfaces of the assembly or device or chassis. At least a portion of at least one of the clamping means or clamping surfaces may be located or mounted in or within or otherwise associated with a depression or recess or slot, which may be elongate, in or of or comprised in or as part of the chassis. The clamping means or depression or recess or slot may be configured for or suitable for receiving an elongate edge of a circuit board.

Another aspect of the invention provides a chassis, e.g. for use in a assembly or device as described above. The chassis may comprise one or more depressions or recesses or slots, which may be elongate, e.g. for receiving an edge, e.g. an elongate edge, of a circuit board. Additionally or alternatively, the chassis may comprise a clamping means, which may be suitable for clamping or configured to clamp, e.g. in use, one or more circuit board edges, e.g. elongate circuit board edges, for example within the or a respective slot and/or in thermal contact with the chassis and/or between a pair of clamping surfaces, e.g. of the clamping means.

At least one of the clamping means or clamping surfaces may be elongate and/or in thermal contact with the circuit board and/or with the chassis. The circuit board may be clamped along two opposed sides to the chassis, for example between respective pairs of clamping surfaces, which may be in thermal contact with the circuit board and/or with the chassis. The assembly or device may comprise an adjustment means for moving at least one of the clamping surfaces, for example at least one expanding wedge type fastener or wedge lock, e.g. for clamping the or at least one or each side of the circuit board and/or which may be thermally conductive. The adjustment means or expanding wedge type fastener or wedge lock may comprise an adjuster or fastener, which may be operable or rotatable to draw a pair of opposed wedges together to urge one of the clamping surfaces against the circuit board. The adjustment means or at least one expanding wedge type fastener or wedge lock may comprise one or more features of the adjustment means or expanding wedge type fastener or wedge lock described above for urging the heat transfer portion or part away from the chassis and/or against the housing or inner surface thereof.

Preferably, the chassis comprises a plurality of depressions or recesses or slots each of which receives or is associated with a clamping means or a pair of clamping surfaces. More preferably, a plurality of circuit boards or electronic cards are mounted to the chassis, for example with one or more, preferably a pair of opposed, elongate edges received within a respective depression or recess or slot and/or clamped by the clamping means or between the clamping surfaces.

The circuit board may comprise a thermally conductive layer, which may extend across at least a portion thereof and/or be embedded therein. The thermally conductive layer may be in thermal contact with the chassis, for example via one or more contact elements, which may be thermally conductive and/or may be on and/or extend across at least part of an external surface of the circuit board.

Another aspect of the invention provides a circuit board, e.g. for use in an assembly or device as described above. The circuit board may comprise a thermally conductive layer, which may be located or embedded within, e.g. centrally within, the circuit board and/or at or adjacent the centre thereof. The circuit board may additionally or alternatively comprise a contact element, e.g. a thermally conductive contact element, on one or more or each surface, e.g. external major surface, thereof, which contact element may be adjacent or in thermal contact with the thermally conductive layer.

The thermally conductive layer may be operatively or thermally connected to the contact element, e.g. by a thermally conductive material, which may, but need not, be electrically conductive. In some embodiments, the material may be electrically insulative, e.g. for preventing or inhibiting signal interference, for example the material may comprise a thermally conductive and/or electrically insulative polymer or epoxy or silicone or elastomeric material. The thermally conductive layer may be operatively or thermally and/or electrically connected to the contact element through a connection, for example one or more through hole vias. The thermally conductive layer may be configured for or suitable for transmitting heat generated, e.g. in use, across the circuit board.

Another aspect of the invention provides a chassis as described above in combination with a circuit board as described above and/or a heat transfer device as described above.

The thermally conductive layer may be in thermal contact with the chassis via two contact elements, e.g. thermally conductive contact elements, at least one or each of which may be on and/or extend across at least part of a respective external surface, e.g. major surface, of the circuit board. The thermally conductive layer may comprise copper.

In some embodiments, the circuit board comprises two or more, e.g. a plurality of, layers, which may be laminated to one another. Preferably, the circuit board comprises a plurality of laminated layers, which may include two or more or a plurality of thermally and/or electrically conductive layers, one of which, for example a redundant one of which, may comprise the thermally conductive layer. The two or more or a plurality of thermally and/or electrically conductive layers may be separated by non-conductive layers, for example each pair of thermally and/or electrically conductive layers may be separated by a respective non-conductive layer, e.g. non-electrically conductive or electrically insulative layer, or less conductive, e.g. less thermally conductive, layer. At least one of the layers, e.g. the electrically and/or thermally conductive layer or layers, may comprise copper. At least one of the layers, e.g. the non-conductive or non-electrically conductive or electrically insulative or less conductive or less thermally conductive layer, may comprise a plastics or polymer layer, such as an epoxy layer, which may comprise a composite material or structure, for example a glass reinforced epoxy layer. In some embodiments, the epoxy layer exhibits thermally conductive and/or electrically insulative properties.

The housing may be hollow and/or cylindrical and/or tubular and/or may comprise a steel material, for example carbon steel, or another material, which is preferably thermally conductive. The chassis preferably comprises a thermally conductive material, such as a metallic material, for example aluminium or another metallic material.

The heat transfer portion or part may comprise a curved or rounded or cylindrical surface, which may be interrupted, which may be urged against and/or in interference fit with an the housing or the inner surface thereof, which may comprise an internal cylindrical surface thereof. The heat transfer portion or part may comprise a thermally conductive material, such as a metal, for example aluminium another metallic material, and/or another, less conductive material, for example a non-metal or a composite or a thermally conductive polymer material. The thermally conductive material may include a composite material or structure, for example with one or more elements included or incorporated or embedded within a matrix material, wherein at least one of the one or more elements and/or the matrix material is thermally conductive. Additionally or alternatively, the thermally conductive material may include thermally conductive fibres, filaments, powder or particles, e.g. nanoparticles, which may comprise a metal or other material and/or be included or incorporated or embedded within a matrix material, for example a polymer matrix material.

In some embodiments, the thermally conductive material of the housing and/or the chassis may comprise a material as described above in respect of the heat transfer portion or part.

Yet another aspect of the invention provides a kit of parts for assembly into a or a housing assembly as described above.

Another aspect of the invention provides a method of assembling an assembly or a device, e.g. as described above, for example a subsea electronic device or housing assembly. The method may comprise mounting one or more electronic elements to a chassis and/or inserting into the housing the or a chassis and/or a heat transfer portion or part, e.g. in thermal contact with the one or more electronic elements, and preferably urging the heat transfer portion or part against and/or into an interference fit with or against the housing or an inner surface thereof, for example such that heat generated from the one or more electronic elements is transferred to the housing, for example through the heat transfer portion or part.

At least part of the heat transfer portion or part may be urged away from the chassis and/or against the inner surface of the housing, for example by an adjustment means. Mounting the one or more electronic elements may involve or comprises clamping an edge, e.g. an elongate edge, of at least one or each of one or more circuit boards, for example into a slot or a respective slot, which may be elongate, in the chassis between a pair of clamping surfaces, which may also be elongate. The method may comprise clamping a contact element, e.g. a thermally conductive contact element, on an edge, e.g. an elongate edge, of at least one circuit board, for example to cause a thermally conductive layer of the circuit board, which may be embedded therein and/or in thermal contact with the contact element, to be in thermal contact with the chassis.

The skilled person would understand that the method may include one or more further features or steps evident from one or more of the other features of the invention described above and herein. The skilled person would also understand that the heat transfer portion or part may be referred to as a heat transfer member or element or section in appropriate circumstances. Similarly, the electronic elements may comprise circuit boards or printed circuit boards or printed wiring boards or electronic cards or even printed wiring assemblies.

Within the scope of this application it is expressly envisaged that the various aspects, embodiments, examples and alternatives set out in the preceding paragraphs, in the claims and/or in the following description and drawings, and in particular the individual features thereof, may be taken independently or in any combination. Features described in connection with one aspect or embodiment of the invention are applicable to all aspects or embodiments, unless such features are incompatible.

BRIEF DESCRIPTION OF THE DRAWINGS

Embodiments of the invention will now be described by way of example only with reference to the accompanying drawings in which.

DETAILED DESCRIPTION OF EXAMPLE EMBODIMENTS

Figure 1:
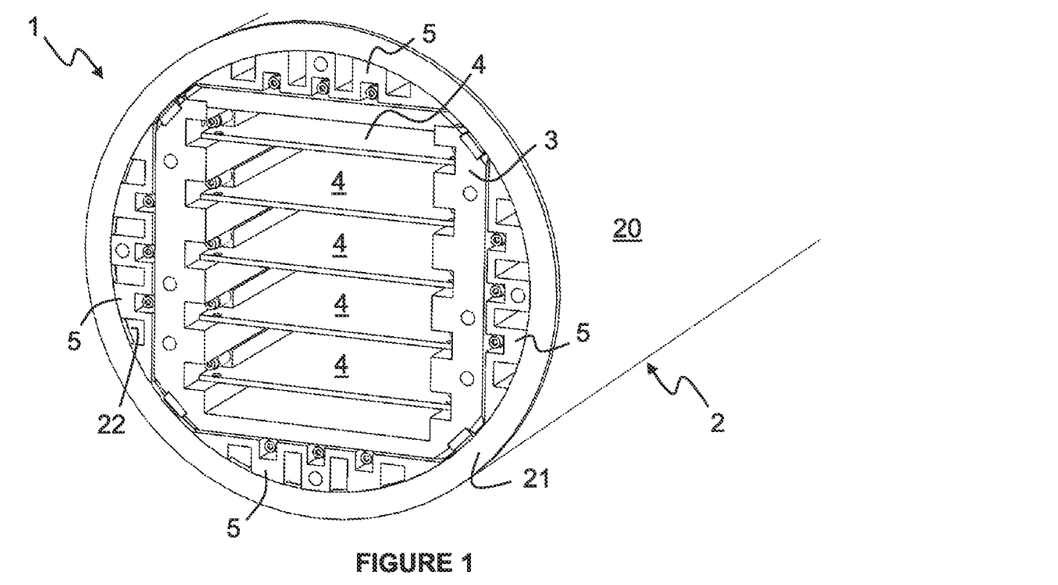
FIG. 1 is a perspective section view of part of a subsea electronic device according to an embodiment of the invention.
Figure 2:
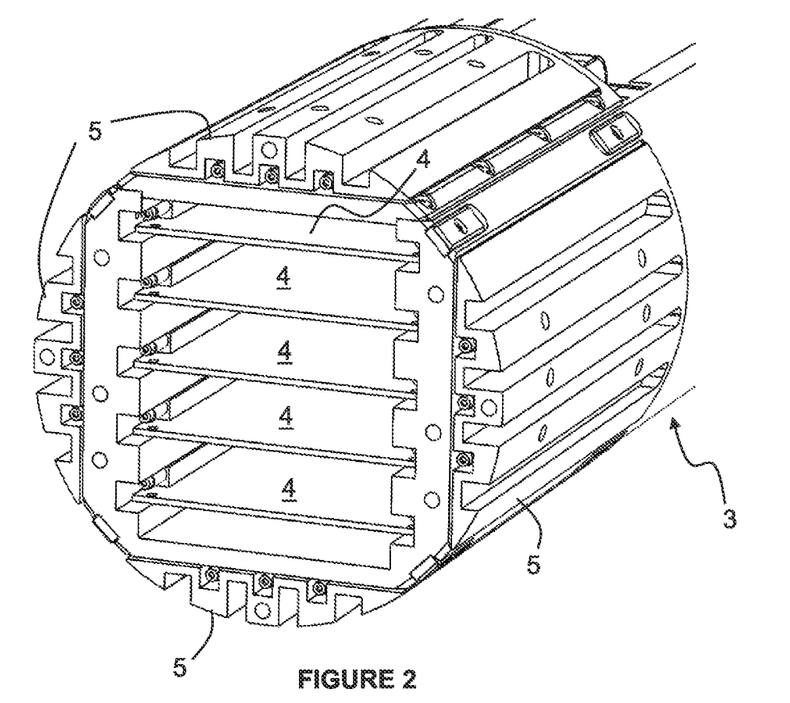
FIG. 2 is a perspective view of the device of FIG. 1 from the opposite end and with the housing omitted.

Referring now to FIGS. 1 and 2, there is shown part of a subsea electronic device 1 according to an embodiment of the invention. The device 1 includes a housing 2, a chassis 3 within the housing 2 to which a series of electronic cards 4 are mounted and four heat transfer sections 5 mounted in an interference fit between the chassis 3 and the housing 2. In this embodiment, the housing 2 is in the form of a hollow cylinder 20 with a closure member (not shown) on each end and is formed of carbon steel. The cylinder 20 is formed of carbon steel in this embodiment and includes a wall 21 with an internal circumferential surface 22.

Figure 3:
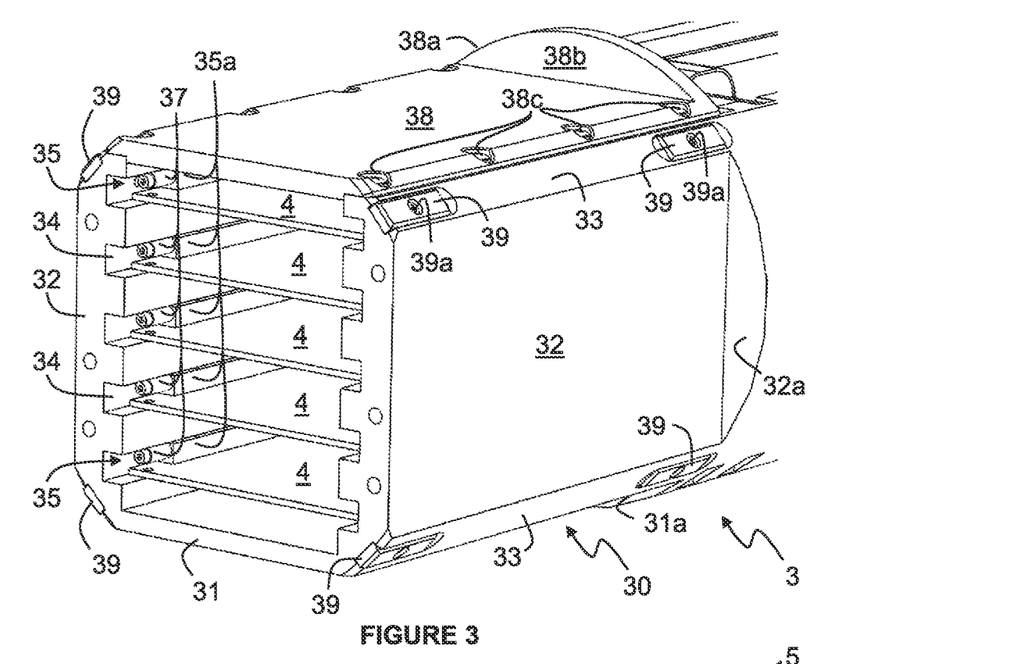
FIG. 3 is a view similar to that of FIGS. 1 and 2 with the heat transfer sections removed.

As shown more clearly in FIG. 3, the chassis 3 according to this embodiment is substantially cylindrical and includes a mounting part 30 with a flat planar base 31 and a pair of side walls 32 extending perpendicularly from the base 31 to form a substantially square U-shaped cross-section with chamfered corners 33. Each side wall 32 includes a series of longitudinal slots 34, five in this embodiment, each of which has a substantially square cross-section and receives a respective electronic card 4. Mounted within each slot 34 is a wedge lock 35 for securing a respective side of one of the electronic cards 4.

Each wedge lock 35 includes a clamp block 35a with an elongate clamping surface and a recess (not shown) with a tapered base surface that lies at an angle with respect to the clamping surface and tapers from a wider end adjacent the front or free end of the mounting part 30. Each clamp block 35a receives a wedge 36 (see FIG. 5) that contacts and cooperates with the tapered surface. A screw fastener 37 connects the front of the clamp block 35a to the wider rear end of the wedge 36 such that by tightening the fastener 37, the wedge 36 is brought toward the front or free end of the mounting part 30, causing the wedge 36 to ride up the tapered base surface of the clamp block 35a. The wedge 36 is secured to the upper surface of the slot 34 in this embodiment, so the tightening of the fastener 37 urges the clamp block 35a toward a lower surface of the slot 34, thereby clamping the electronic card 4 therebetween. In this embodiment, the wedge locks 34 are formed of aluminium.

The outer surface of the base 31 and side walls 32 of the mounting part 30 are formed by depressions in the cylindrical chassis 3, which results in respective shoulder surfaces 31a, 32a. The chassis 3 includes a cover member 38 for covering the open top of the mounting part 30, which includes a flange 38a that provides a shoulder surface 38b similar to the shoulder surfaces 31a, 32a at the ends of the base 31 and side walls 32. The cover member 38 is secured to each of the side walls 32 by four bolts 38c. The chassis 3 and cover member 38 are both formed of aluminium in this embodiment.

In this embodiment, two plastic bearing blocks 39 are mounted within respective recesses in each of the four chamfered corners 33 with respective bolts 39a, one adjacent each end of the mounting part 30 such that the bearing blocks 39 protrude from the chamfered corners 33. Thus, as the chassis 3 is inserted into the housing 2 the bearing blocks 39 contact the internal circumferential surface 22 in preference to the hard and sharp corners of the chassis 3 to locate the chassis 3 centrally within the housing 2 whilst protecting the internal surface 22.

Figure 5:
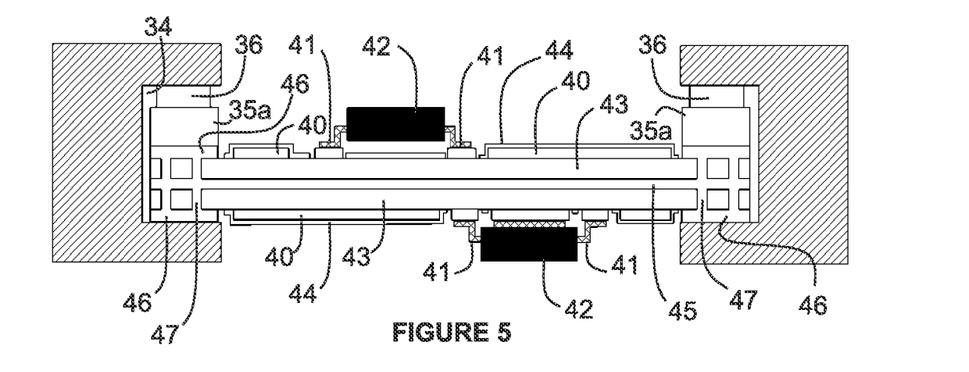
FIG. 5 is a partial cross-sectional view of one of the electronic cards received within the chassis of the device of FIG. 1.
Figure 6:
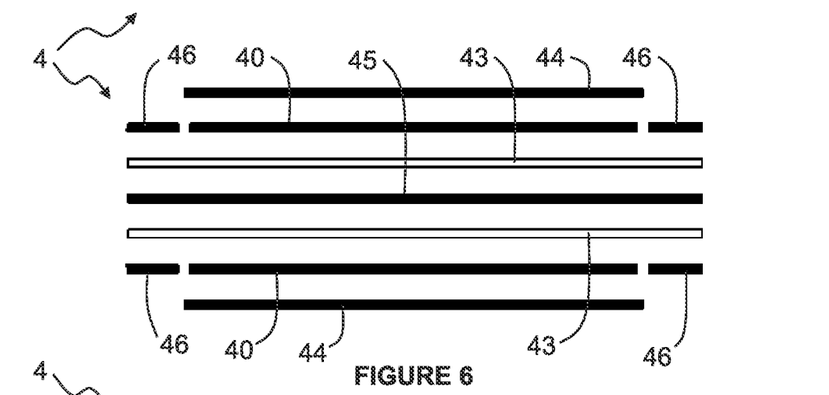
FIG. 6 is a schematic illustration of the layers of the card of FIG. 5.

As shown more clearly in FIGS. 5 and 6, the electronic cards 4 in this embodiment are printed wiring boards, or printed circuit boards 4, which are manufactured by sandwiching multiple copper layers 40 incorporating circuit connections 41 to which electronic components 42 are connected, with glass reinforced epoxy layers 43 therebetween. The glass reinforced epoxy layers 43 are not electrically conductive, thereby ensuring that the circuits on different copper layers 40 do not connect electrically with each other except in the desired positions. Exposed copper traces of the outer copper layers 40 are covered by a solder resist layer 44 for protection against oxidation and to prevent solder bridges from forming between closely spaced solder pads.

Where interconnections are required between circuits on different copper layers 40, a plated through hole connection is made between the layers 40. On each copper layer 40 where the through hole is required a copper via pad is defined and aligned with a corresponding pad on the destination layer 40. On all layers 40 where the connection is not required the copper is removed from the via site. Typically, a drill bit or laser (not shown) is used to drill through the centre of the via pads. The hole is then electro plated, which results in an electrical connection between the via pads on the different copper layers 40.

Figure 7:
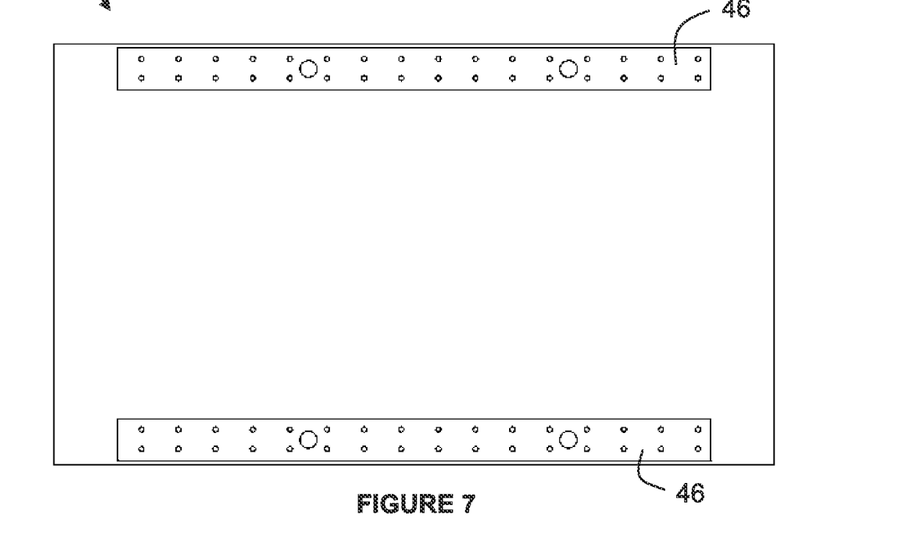
FIG. 7 is a plan view of the card of FIG. 5 with the electronic components omitted illustrating the contact strips.

Each electronic card 4 in this embodiment includes an additional, redundant copper layer 45 within the card 4 connected to isolated copper strips 46 on the outer copper layers 40 through rows of copper through hole vias 47. This additional copper layer 45 is not used to carry electrical power or electrical signals, rather it is a heat transfer layer 45 used to transmit heat generated across the card 4 to the copper strips 46. In an alternative embodiment, the electrical connections 47 between the copper strips 46 and the redundant copper layer 45 are replaced with electrically insulative connections 47 formed using a thermally conductive and electrically insulative polymer or epoxy or silicone or elastomeric material. This can be particularly advantageous in avoiding, or at least mitigating, signal interference that might otherwise result in an electrical connection between the copper strips 46 and the redundant copper layer 45.

The heat transferred from the electronic components 42 to the electronic card 4 will conduct through the various copper layers 40 and glass reinforced epoxy layers 43 to the heat transfer layer 45. The inventors have found that surprisingly, the thermal conductivity of the glass reinforced epoxy layer 43 is good enough to allow a significant transfer of heat to the heat transfer layer 45 and out through the copper strips 46.

Figure 4:
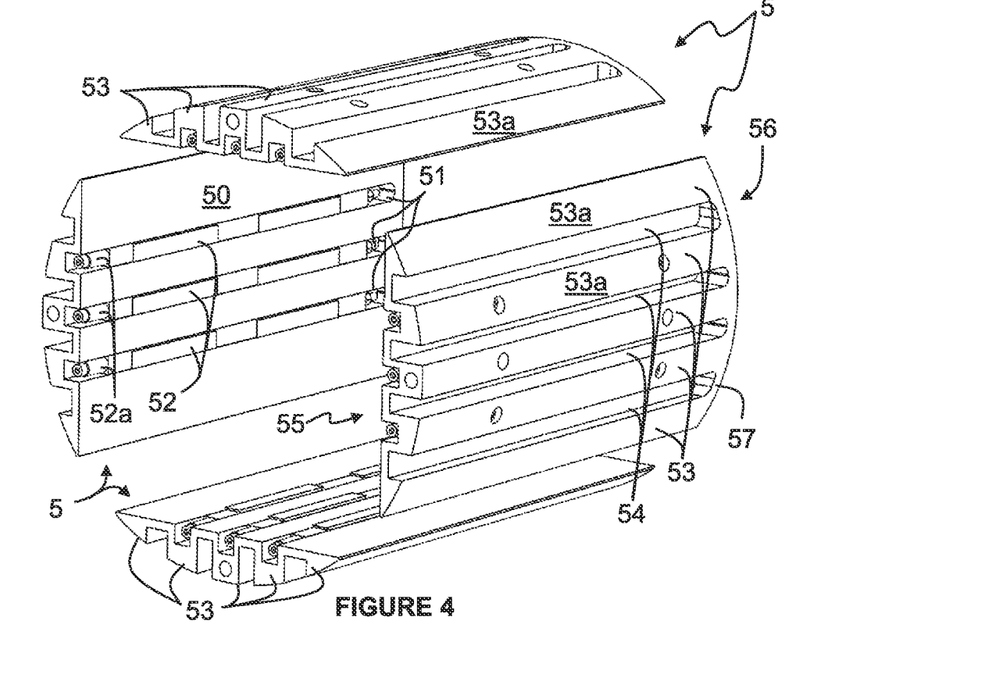
FIG. 4 is a perspective view of the four heat transfer sections of the device of FIGS. 1 to 3.

As shown more clearly in FIG. 4, each heat transfer section 5 according to this embodiment includes an inner, planar base 50 with three longitudinal slots 51 each with a wedge lock 52 mounted therein. Each wedge lock 52 includes a screw adjustment fastener 52a and is similar in construction and function to the wedge locks 35 described above and therefore will not be described further herein. Projecting outwardly from the base 50 are five longitudinal heat transfer ribs 53 that define an interrupted, part-cylindrical peripheral surface 53a. The ribs 53 are defined by longitudinal depressions 54 between each pair extending from a first end 55 of the heat transfer section 5 and terminating adjacent a second end 56 thereof, such that the longitudinal ribs 53 are interconnected by a transverse rib 57 extending across the second end 56. Each of the longitudinal slots 51 in the base 50 is aligned with one of the second, third and fourth ribs 53 and also extends from the first end 55 and terminates adjacent the second end 56. The resulting geometry of the base 50 results in deformable or flexible portions of thinned cross section between the ribs 53, which enable the heat transfer section 5 to deform in use.

In this embodiment, the heat transfer sections 5 are formed of aluminium. However, in some applications the heat transfer section 5 may be formed of another thermally conductive material, such as a non-metal or a composite or a thermally conductive polymer material.

To assemble the device 1, each electronic card 4 is inserted into a respective slot 34 of the chassis 3 with the copper strips 46 captivated between the wedge lock 35 and the base of the slot 34. The fastener 37 of the relevant wedge lock 35 is then rotated using a suitable tool (not shown) to draw the wedge 36 toward the front or free end of the mounting part 30, thereby causing it to ride up the tapered base surface of the clamp block 35a. This causes the wedge lock 35 to expand so that the elongate clamping surface contacts the copper strip 46 on the top of the electronic card 4, forcing the card down against the base of the slot 34. This creates both a strong clamping force to retain the card 4 in place and creates an intimate thermal contact between the aluminium wedge lock 34 and the copper strip 46 on the top of the electronic card 4 and between the base of the slot 34 of the aluminium chassis 3 and the copper strip 46 on the bottom of the electronic card 4. This process is repeated for each longitudinal side of each electronic card 4.

The chassis 3 with the electronic cards 4 mounted therein is then inserted into the housing 2 such that the bearing blocks 39 contact the internal circumferential surface 22 and loosely centralize the chassis 3 within the housing 2. Each of the four heat transfer sections 5 are then inserted into one of the gaps between the inner surface 22 of the housing 2 and the base 31, side walls 32 and cover member 38 until it abuts the relevant shoulder surface 31a, 32a, 38b. The wedge locks 52 are then adjusted to expand, thereby forcing the interrupted, part-cylindrical peripheral surface 53a of each heat transfer section 5 against the inner surface 22 of the housing. The wedge locks 52 are adjusted in a diagonal sequence to ensure an even distribution of stress within the housing 2. It will be appreciated that as the wedge locks 52 expand, the heat transfer sections 5 deform by virtue of the aforementioned thinner sections in order to conform to the internal surface 22 of the housing 2. This minimizes any gaps between the two surfaces 53a, 22 that might otherwise result from manufacturing tolerances, Thus, the heat transfer sections 5 support rigidly the chassis 3 centrally within the housing 2 and protect the electronic cards 4 against vibration and shock.

During operation of the device 1, heat generated by the electronic components 42 and across the card 4 is transferred to the heat transfer layer 45 through the hole vias 47, to the copper strips 46, through the wedge locks 35 and chassis 3, through the wedge locks 52 and heat transfer sections 5, into the housing 2 and out to the surrounding environment.

Thus, the arrangement of the device 1 takes advantage of the environment that subsea electronics modules are operated in, that is to say within a liquid environment (either seawater or in a dielectric oil). This provides an effective transfer of heat from the housing 2 to the surrounding environment.

It will be appreciated by those skilled in the art that several variations to the aforementioned embodiments are envisaged without departing from the scope of the invention. For example, the device may include more or less heat transfer sections 5, but where more than one is included they are preferably distributed evenly about the periphery of the chassis 3. The geometry or material of the heat transfer section 5 or indeed any of the components may vary without departing from the scope of the invention. Specifically, the heat transfer section 5 may comprise more or less ribs 53, or the ribs 53 may even be omitted, and/or the deformable nature of the design may be modified or more exaggerated or omitted altogether.

Additionally or alternatively, the chassis 3 and one or more heat transfer sections 5 may be formed integrally or bolted together, for example wherein the heat transfer sections 5 are rigidly connected to the chassis 3 and/or include only a portion that is movable or deformable to engage the walls of the housing 2. The housing need not be cylindrical or tubular or even hollow; it may comprise any cross-sectional shape or geometry. The electronic cards 4 may be replaced with different electronic devices or elements that generate heat.

Moreover, the number of wedge locks 35, 52 may increase or decrease according to various requirements and/or circumstances and/or their construction may vary and/or they may be replaced with another mounting and/or expanding element or mechanism or means, but preferably one which ensures or promotes at least to some extent a thermal contact between the cards 4 and the chassis 3 and/or between the chassis and the heat transfer sections 5 and the housing 2. For example, in the case of wedge locks 35, these may be replaced with a clamping element that is secured to the lower surface of the slot 34 by one or more, e.g. a plurality of bolts or screws. Similarly, any suitable expanding mechanism may be used to replace wedge locks 52. Alternatively, the electronic cards 4 may simply be inserted in an interference fit, for example wherein the slots are slightly undersized or with the assistance of one or more shims. Similarly, one or more shims or wedges may be inserted between the flat base 50 of the heat transfer section 5 and the chassis 3 to urge the heat transfer section 5 against the housing 2.

It will also be appreciated by those skilled in the art that any number of combinations of the aforementioned features and/or those shown in the appended drawings provide clear advantages over the prior art and are therefore within the scope of the invention described herein.

The invention claimed is:

1. A subsea electronic device comprising:
a thermally conductive hollow subsea housing;
a thermally conductive chassis disposed within the housing;
one or more electronic elements mounted to and in thermal contact with said chassis; and
plural heat transfer structures disposed between said chassis and an inner surface of said housing, said heat transfer structures being in thermal contact with the inside surface of the housing and the chassis thereby providing thermal conduction from the one or more electronic elements to said subsea housing;
wherein
the heat transfer structures are in interference fit with said inner surface of the housing thereby to transfer, in use, heat from the one or more electronic elements through the heat transfer structures to the housing;

at least one of the electronic elements comprises a circuit board clamped along at least one of its sides to the chassis between a pair of elongate clamping surfaces in thermal contact with the circuit board and with the chassis;

the circuit board comprises a thermally conductive layer across at least a portion thereof, which thermally conductive layer is in thermal contact with the chassis;

at least part of each heat transfer structure is movable relative to at least a portion of the chassis to create the interference fit; and each heat transfer structure comprises a wedge-shaped adjustment member configured to urge the at least part of the heat transfer structure away from the chassis and against the inner surface.

2. The subsea electronic device according to claim 1, wherein the wedge-shaped adjustment member comprises one or more thermally conductive wedge locks.

3. The subsea electronic device according to claim 1, wherein each heat transfer structure comprises a deformable region configured to deform, in use, as it is urged against the inner surface.

4. The subsea electronic device according to claim 3, wherein each heat transfer structure comprises a recess or depression defining at least in part the deformable region.

5. The subsea electronic device according to claim 1, wherein
each heat transfer structure comprises two or more heat transfer elements with a respective recess or depression between each pair, and
each of the heat transfer elements is in thermal contact with the one or more electronic elements and in interference fit with the inner surface of the housing.

6. The subsea electronic device according to claim 1 comprising two heat transfer structures, one on each of opposite sides of the chassis each of which heat transfer structures is in thermal contact with the one or more electronic elements and in interference fit with a corresponding inner surface of the housing.

7. The subsea electronic device according to claim 1 comprising three or more heat transfer structures disposed about the periphery of the chassis, each of which is in thermal contact with the one or more electronic elements and in interference fit with a corresponding inner surface of the housing.

8. The subsea electronic device according to claim 1, wherein the circuit board is clamped along two opposed sides to the chassis between respective pairs of elongate clamping surfaces in thermal contact with the circuit board and with the chassis.

9. The subsea electronic device according to claim 1 comprising a thermally conductive wedge lock for clamping at least one side of the circuit board.

10. The subsea electronic device according to claim 1, wherein the thermally conductive layer is in thermal contact with the chassis via one or more thermally conductive contact elements on an external surface of the circuit board.

11. The subsea electronic device according to claim 1, wherein the thermally conductive layer is in thermal contact with the chassis via two thermally conductive contact elements each on a respective external major surface of the circuit board.

12. The subsea electronic device according to claim 1, wherein the thermally conductive layer comprises copper.

13. The subsea electronic device according to claim 1, wherein the housing comprises a hollow cylindrical housing and the heat transfer structures each comprise a curved surface in interference fit with an internal cylindrical surface of the housing.

14. A heat transfer device for use as one of the heat transfer structure in the subsea electronic device according to claim 1.

15. The chassis for use in the subsea electronic device according to claim 1, the chassis comprising one or more elongated slots for receiving an elongated edge of the circuit board and a clamping member configured to clamp, in use, one or more elongated circuit board edges within a respective elongated slot and in thermal contact with the chassis.

16. The circuit board for use in the subsea electronic device according to claim 1, the circuit board comprising an integrally embedded thermally conductive layer in thermal contact with thermally conductive contact elements on each external major surface of the circuit board for transmitting heat generated, in use, across the circuit board.

17. A subsea electronic device housing assembly comprising:
a thermally conductive hollow subsea housing;
a thermally conductive chassis disposed within the housing;
one or more electronic elements mounted to and in thermal contact with said chassis; and
plural heat transfer structures disposed between said chassis and an inner surface of said housing, said heat transfer structures being in thermal contact with the chassis;
wherein
the heat transfer structures are in interference fit with the inner surface of the housing to enable heat to be transferred, in use, from one or more electronic elements mounted to the chassis through the heat transfer structures to the housing;
at least one of the electronic elements comprises a circuit board clamped along at least one of its sides to the chassis between a pair of elongate clamping surfaces in thermal contact with the circuit board and with the chassis;
the circuit board comprises a thermally conductive layer across at least a portion thereof, which thermally conductive layer is in thermal contact with the chassis;
at least part of each heat transfer structure is movable relative to at least a portion of the chassis to create the interference fit; and
each heat transfer structure comprises a wedge-shaped adjustment member configured to urge the at least part of the heat transfer structure away from the chassis and against the inner surface.

18. A method of assembling a subsea electronic device comprising:
mounting one or more circuit boards carrying electronic elements to and in thermal contact with a chassis;
inserting the chassis and plural heat transfer structures disposed about the periphery of the chassis into a hollow subsea housing that is in thermal contact with the one or more electronic elements via a thermally conducting layer; and
urging the heat transfer structures into an interference fit against an inner surface of the housing such that heat generated from the one or more electronic elements is transferred via the thermally conducting layer through the heat transfer structures to the housing;

wherein at least part of each heat transfer structure is urged away from the chassis and against the inner surface of the housing by an adjustment member to create said interference fit.

19. The method according to claim 18, wherein the step of mounting one or more electronic elements comprises clamping an elongate edge of each of one or more circuit boards into a respective elongate slot in the chassis between a pair of elongate clamping surfaces.

20. The method according to claim 19 comprising: clamping a thermally conductive contact element on an elongated edge of at least one circuit board to cause the thermally conductive layer to be in thermal contact with the thermally conductive contact element to be in thermal contact with the chassis.

* * * * *